United States Patent
Pouarz et al.

(10) Patent No.: US 7,546,561 B2
(45) Date of Patent: Jun. 9, 2009

(54) SYSTEM AND METHOD OF STATE POINT CORRESPONDENCE WITH CONSTRAINED FUNCTION DETERMINATION

(75) Inventors: Travis W. Pouarz, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 11/420,264

(22) Filed: May 25, 2006

(65) Prior Publication Data
US 2007/0277068 A1 Nov. 29, 2007

(51) Int. Cl.
G06F 17/50 (2006.01)

(52) U.S. Cl. .................. 716/3; 716/4; 716/5; 716/6; 703/14; 703/15; 714/726

(58) Field of Classification Search .............. 716/3–6; 703/14–15; 714/726
See application file for complete search history.

(56) References Cited

U.S. PATENT DOCUMENTS

| | | | | |
|---|---|---|---|---|
| 6,086,626 | A * | 7/2000 | Jain et al. ............... | 716/5 |
| 6,567,959 | B2 * | 5/2003 | Levin et al. ............. | 716/5 |
| 6,634,012 | B2 * | 10/2003 | Zhong et al. ............ | 716/5 |
| 6,742,174 | B1 * | 5/2004 | Chen et al. ............. | 716/18 |
| 6,745,377 | B2 * | 6/2004 | Baumgartner et al. .... | 716/6 |
| 7,032,192 | B2 * | 4/2006 | Prasad et al. ........... | 716/3 |
| 7,055,118 | B1 * | 5/2006 | Kamepalli et al. ....... | 716/5 |
| 7,159,201 | B2 * | 1/2007 | Moondanos et al. ...... | 716/7 |
| 7,260,799 | B2 * | 8/2007 | Baumgartner et al. .... | 716/5 |
| 7,299,432 | B2 * | 11/2007 | Baumgartner et al. .... | 716/4 |
| 7,350,168 | B1 * | 3/2008 | Mathur et al. ........... | 716/5 |

* cited by examiner

*Primary Examiner*—Naum B Levin
(74) *Attorney, Agent, or Firm*—Casimer K. Salys; Jack V. Musgrove

(57) ABSTRACT

A system and method for determining scan chain correspondence including defining a reference scan chain having reference latches and a reference constraint, each of the reference latches having a reference latch logic cone, the reference constraint having a reference constraint logic cone and being associated with one of the reference latches; defining an implementation scan chain having implementation latches and an implementation constraint, each of the implementation latches having an implementation latch logic cone, the implementation constraint having an implementation constraint logic cone and being associated with one of the implementation latches; matching known corresponding scan points between the reference scan chain and the implementation scan chain; and determining scan chain functional correspondence between the reference latches and the implementation latches from the reference latch logic cones with any associated reference constraint logic cone and the implementation latch logic cones with any associated implementation constraint logic cone.

4 Claims, 9 Drawing Sheets

SYSTEM AND METHOD OF STATE POINT CORRESPONDENCE WITH CONSTRAINED FUNCTION DETERMINATION

TECHNICAL FIELD

The technical field of this disclosure is integrated circuits, particularly, state point correspondence with constrained function determination.

BACKGROUND OF THE INVENTION

Integrated circuits have grown in complexity and number of components such that the typical design methodology requires a series of design levels between a general logic circuit description and the manufacturing level description. Examples of the design levels are the high level register-transfer-level (RTL) description and the low level netlist description. The RTL description is synthesized into a netlist description, which is then converted into a physical semiconductor circuit layout. The RTL description describes the operation of the integrated circuit under design independent of any particular technology. The netlist is a data structure representation of the electronic logic system, which describes how standard cells and blocks are interconnected.

Because of the number of design levels, design verification is required to verify that the optimizations and transformations introduced during the design process do not alter the intended design logic. One common type of design verification is combinational Boolean equivalence checking. Two design levels, known as the reference and the implementation, such as the RTL description and the netlist description, are broken up into combinatorial, cycle-free blocks, often termed "logic cones." Formal techniques are used to compare and verify the logic cones from the reference and the implementation. The comparison of all corresponding logic cones demonstrates the equivalence of the reference and the implementation, without the need to apply simulation test patterns.

An important part of combinational Boolean equivalence checking is identifying and matching compare points in the reference and the implementation. Compare points are among the combinational logic end points used in verification. Compare points include output ports, latches, and registers. Matching compare points assures that logic cones are only compared for equivalence if they are expected to be equivalent in a correct design.

Compare point matching techniques can be broadly classified as function-based and non-function-based methods. Function-based methods implicitly enumerate all compare point combinations and pair functionally equivalent compare points. A logic function is constructed for each latch and the logic function of each latch is checked against the logic functions of other latches until all the latches are paired. Non-function-based methods use heuristic methods to match the compare points. Equivalence of pairs of compare points is guessed based on evidence such as similarity of compare point names or logic topology. The guessing continues until all the compare points are paired.

Both the function-based and non-function-based methods present problems when used alone. The function-based methods are exact methods, but require expensive, non-trivial computation. The function-based methods require at least the performance of a complete equivalence check. In the worst case, the computation can time out and terminate before the matching and verification is complete, resulting in failure without any useful result. The non-function-based methods can fail on encountering particular conditions in the reference and the implementation.

It would be desirable to have a system and method of state point correspondence with constrained function determination that would overcome the above disadvantages.

SUMMARY OF THE INVENTION

The system and method of state point correspondence with constrained function determination of the present invention combines function-based and non-function-based methods of scan point matching. Known corresponding scan points are matched for two scan chains, and then scan chain functional correspondence is determined. This is much simpler than applying a full function-based method, while avoiding the traps that can occur with particular designs when applying non-function-based methods.

One aspect of the present invention provides a method for determining scan chain correspondence including defining a reference scan chain having reference latches and at least one reference constraint, each of the reference latches having a reference latch logic cone, the reference constraint having a reference constraint logic cone and being associated with at least one of the reference latches; defining an implementation scan chain having implementation latches and at least one implementation constraint, each of the implementation latches having an implementation latch logic cone, the implementation constraint having an implementation constraint logic cone and being associated with at least one of the implementation latches; matching known corresponding scan points between the reference scan chain and the implementation scan chain; and determining scan chain functional correspondence between the reference latches and the implementation latches from the reference latch logic cones with any associated reference constraint logic cone and the implementation latch logic cones with any associated implementation constraint logic cone.

Another aspect of the present invention provides an information handling system including a processor, and a memory coupled to said processor to store instructions executable by a digital processing apparatus to perform operations to determine scan chain correspondence. The operations include defining a reference scan chain having reference latches and at least one reference constraint, each of the reference latches having a reference latch logic cone, the reference constraint having a reference constraint logic cone and being associated with at least one of the reference latches; defining an implementation scan chain having implementation latches and at least one implementation constraint, each of the implementation latches having an implementation latch logic cone, the implementation constraint having an implementation constraint logic cone and being associated with at least one of the implementation latches; matching known corresponding scan points between the reference scan chain and the implementation scan chain; and determining scan chain functional correspondence between the reference latches and the implementation latches from the reference latch logic cones with any associated reference constraint logic cone and the implementation latch logic cone with any associated implementation constraint logic cone.

Another aspect of the present invention provides a computer program product embodied in a computer readable medium storing a computer program executable by a digital processing apparatus to perform operations to determine scan chain correspondence The operations include defining a reference scan chain having reference latches and at least one reference constraint, each of the reference latches having a reference latch logic cone, the reference constraint having a reference constraint logic cone and being associated with at least one of the reference latches; defining an implementation scan chain having implementation latches and at least one implementation constraint, each of the implementation latches having an implementation latch logic cone, the implementation constraint having an implementation constraint logic cone and being associated with at least one of the implementation latches; matching known corresponding scan points between the reference scan chain and the implementation scan chain; and determining scan chain functional correspondence between the reference latches and the implementation latches from the reference latch logic cones with any associated reference constraint logic cone and the implementation latch logic cone with any associated implementation constraint logic cone.

Another aspect of the present invention provides a computer program product embodied in a computer readable medium storing a computer program executable by a digital processing apparatus to perform operations to determine a constrained function. The operations include defining a scan chain having latches and constraints, each of the latches having a latch logic cone, the each of the constraints having a constraint logic cone and being associated with at least one of the latches; constructing a latch function for each of the latches from the latch logic cone for the latch; constructing a constraint function for each of the constraints from the constraint logic cone for the constraint; determining for each of the latches whether at least one of the latch logic cone inputs for the latch is the same as at least one of the constraint logic cone inputs; defining the latch function as the constrained function when at least one of the latch logic cone inputs for the latch is not the same as at least one of the constraint logic cone inputs; ANDing the latch function and the constraint function to generate an intermediate function having an intermediate logic cone with intermediate logic cone inputs for each of the latches when at least one of the latch logic cone inputs for the latch is the same as at least one of the constraint logic cone inputs; determining for each of the latches having an intermediate function whether at least one of the intermediate logic cone inputs for the latch is the same as at least one of the constraint logic cone inputs; ANDing the intermediate function and the constraint function to modify the intermediate function for each of the latches having an intermediate function when at least one of the intermediate logic cone inputs for the latch is the same as at least one of the constraint logic cone inputs; repeating the determining for each of the latches having an intermediate function whether at least one of the intermediate logic cone inputs for the latch is the same as at least one of the constraint logic cone inputs and the ANDing the intermediate function and the constraint function to modify the intermediate function until no additional intermediate logic cone inputs for the latch are the same as the constraint logic cone inputs; and existentially quantifying the intermediate function to generate the constrained function.

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

DESCRIPTION OF A PREFERRED EMBODIMENT

Figure 1:
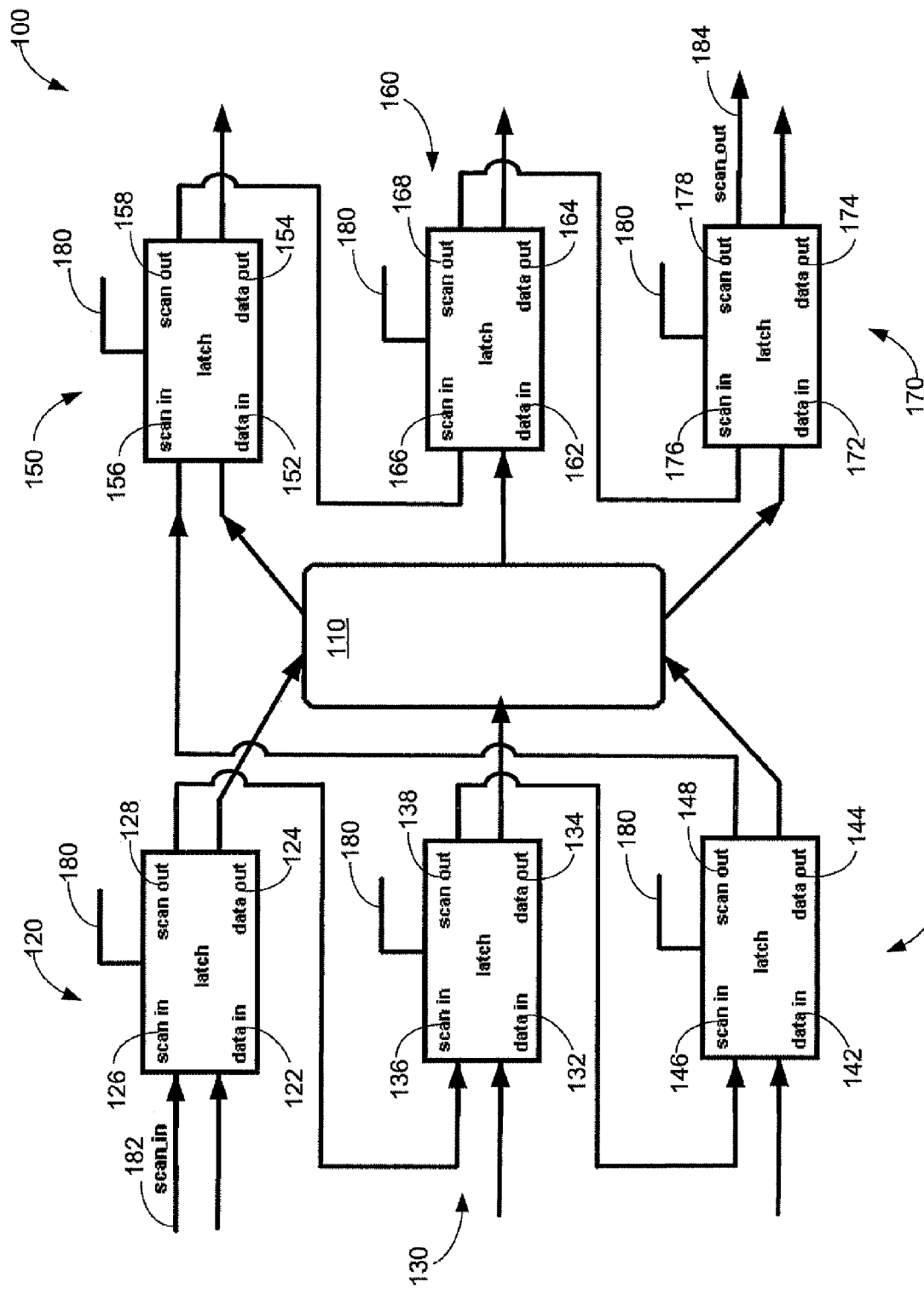
FIG. 1 is a block diagram of a functional view of a circuit design model configured for determination of state point correspondence in accordance with the present invention.

FIG. 1 is a block diagram of a functional view of a circuit design model configured for determination of state point correspondence in accordance with the present invention.

The circuit design model 100 includes a number of latches operably connected to the other latches and to the functional logic 110. Each of the latches has scan-in, scan-out, data-in, data-out, and clock pins. Latches 120, 130, and 140 are operably connected to receive data at data-in 122, 132, and 142, respectively. The data exits the latches 120, 130, and 140 at data-out 124, 134, and 144, respectively, and passes to the functional logic 110. The functional logic 110 is operably connected to provide data to latches 150, 160, and 170 at data-in 152, 162, and 172, respectively. The data exits the circuit design model 100 from the latches 150, 160, and 170 at data-out 154, 164, and 174, respectively. Each of the latches is operably connected to receive a clock signal 180.

Each of the latches includes scan-in and scan-out pins to facilitate design verification. The connection of the scan-in and scan-out pins provides a scan chain through the latches of the circuit design model 100. When the circuit design model 100 is in the scan mode for testing, the latches act as serial shift registers. The scan-in and scan-out pins of the latches are operably connected in series, i.e., scan-out 128 of the latch 120 is operably connected to scan-in 136 of the latch 130, scan-out 138 of the latch 130 is operably connected to scan-in 146 of the latch 140, and so on, with scan-out 148 operably connected to scan-in 156, scan-out 158 operably connected to scan-in 166, and scan-out 168 operably connected to scan-in 176. Scan-in 126 of the latch 120 is operably connected to receive a scan_in signal 182 entering the circuit design model 100 and scan-out 178 of the latch 170 is operably connected to provide a scan_out signal 184 exiting the circuit design model 100. Those skilled in the art will appreciate that any integrated circuit or portion of an integrated circuit including a sequential circuit can be modeled as one or a number of scan chains including latches and functional logic. The particular modeling of the circuit design can be varied as desired for the particular application.

Controls are applied to the circuit design model 100 to simplify it to a scan chain. The clock signal 180 and any other functional clocks are set to constants to turn off the functional clocks. When the latches include separate scan and functional clocks, the scan clocks can be allowed to run. The data signals received by the circuit design model 100 at the data-in 122, 132, and 142 are set to a constant, such as a logic zero. The values internal to the functional logic 110 for the particular application are set so that the data signals to the data-in 152, 162, and 172 are constant. Thus, all data-in pins are set to constants.

Figure 2:
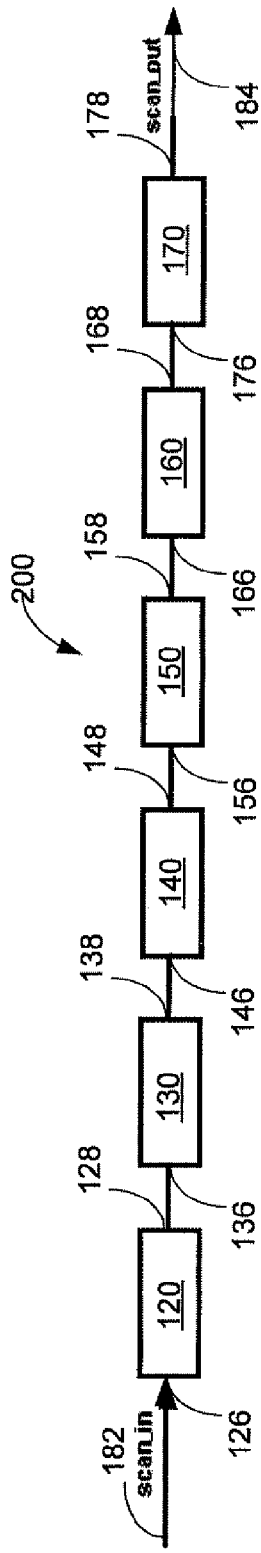
FIG. 2 is a block diagram of a scan chain for the circuit design model of FIG. 1 configured for determination of state point correspondence in accordance with the present invention.

FIG. 2, in which like elements share like reference numbers, is a block diagram of a scan chain for the circuit design model of FIG. 1 configured for determination of state point correspondence accordance with the present invention. The circuit design model is restricted to scan logic to avoid the complication of determining a general logic function for each latch.

The clock signal and data-in pins are set or forced to a constant, so that the clock signal and data-in pins are no longer active in scan chain 200. In another embodiment, the scan clocks are optionally allowed to operate as part of the scan logic. The scan chain 200, also known as a scan ring, is a linear ordered group of latches for a circuit design. The scan chain 200 includes the latches 120, 130, 140, 150, 160, and 170. Scan-out 128 of the latch 120 is operably connected to scan-in 136 of the latch 130, scan-out 138 of the latch 130 is operably connected to scan-in 146 of the latch 140, and so on, with scan-out 148 operably connected to scan-in 156, scan-out 158 operably connected to scan-in 166, and scan-out 168 operably connected to scan-in 176. Scan-in 126 of the latch 120 is operably connected to receive a scan_in signal 182 entering the scan chain 200 and scan-out 178 of the latch 170 is operably connected to provide a scan_out signal 184 exiting the scan chain 200.

Figure 3:
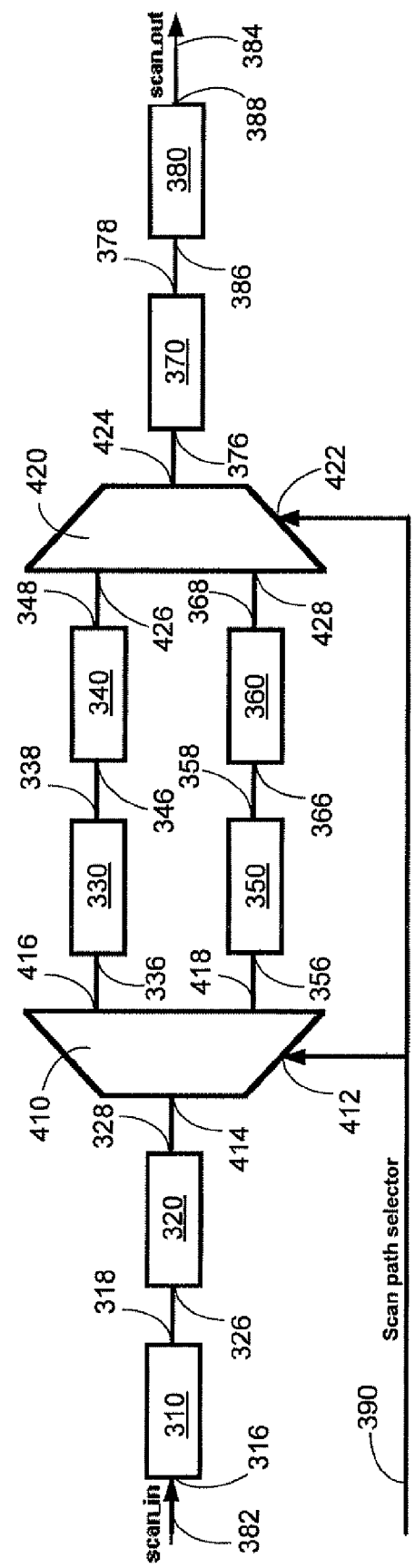
FIG. 3 is a block diagram of another scan chain configured for determination of state point correspondence in accordance with the present invention.

FIG. 3 is a block diagram of another scan chain configured for determination of state point correspondence accordance with the present invention. Scan chain 300 includes multiplexing so that the path through the scan chain 300 depends on a scan_path_selector signal 390.

The scan chain 300 includes latches 310, 320, 330, 340, 370, and 380 as a first scan chain path and latches 310, 320, 350, 360, 370, and 380 as a second scan chain path. Input multiplexer 410 and output multiplexer 420 are responsive to the scan_path_selector signal 390 to switch between the first scan chain path and the second scan chain path. The latch 310 receives scan_in signal 382 entering the scan chain 300 at scan-in 316. Scan-out 318 of the latch 310 is operably connected to scan-in 326 of the latch 320, and scan-out 328 of the latch 320 is operably connected to input 414 of the input multiplexer 410.

The input multiplexer 410 is responsive to the scan_path_selector signal 390 received at select 412 to switch the path through the input multiplexer 410 between the input 414 to the first output 416 and the input 414 to the second output 418. The first output 416 of the input multiplexer 410 is operably connected to scan-in 336 of the latch 330, scan-out 338 of the latch 330 is operably connected to scan-in 346 of the latch 340, and scan-out 348 of the latch 340 is operably connected to first input 426 of the output multiplexer 420. The second output 418 of the input multiplexer 410 is operably connected to scan-in 356 of the latch 350, scan-out 358 of the latch 350 is operably connected to scan-in 366 of the latch 360, and scan-out 368 of the latch 360 is operably connected to first input 428 of the output multiplexer 420.

The output multiplexer 420 is responsive to the scan_path_selector signal 390 received at select 422 to switch the path through the output multiplexer 420 between the first input 426 to the output 424 and the second input 428 to the output 424. The output 424 of the output multiplexer 420 is operably connected to scan-in 376 of the latch 370, scan-out 378 of the latch 370 is operably connected to scan-in 386 of the latch 380, and scan-out 388 of the latch 380 is operably connected to provide a scan_out signal 384 exiting the scan chain 300. Those skilled in the art will appreciate that the scan chain can include more than one pair of multiplexers and that the multiplexers can be more than dual path, e.g., four-to-one or eight-to-one multiplexers rather than the exemplary two-to-one multiplexer of FIG. 3. The number and path number of the multiplexers can be used to model the circuit design as desired for a particular application.

Some multiplexers, such as multiplexers using decoded selects, and certain other circuit structures require a constraint because two models are only Boolean equivalent under the condition that the constraint imposes. Consider the example of a multiplexer with two selector signals, a and b. In this example, the upper path is chosen when a=1 and b=0, and the lower path is chosen when a=0 and b=1. This is a "decoded" selector signal that needs a "hot-1" constraint, i.e., one line is a "1" or "hot" while all other lines are "0" or "cold." Only the combinations 10 and 01 are valid. The other combinations of 00 and 11 may produce unexpected results, including different results between the two models. Therefore, a constraint is required so that only 01 and 10 are allowed. The user specifies the constraint, such as specifying the constraint by implanting the constraint into the design by notation.

Figure 4:
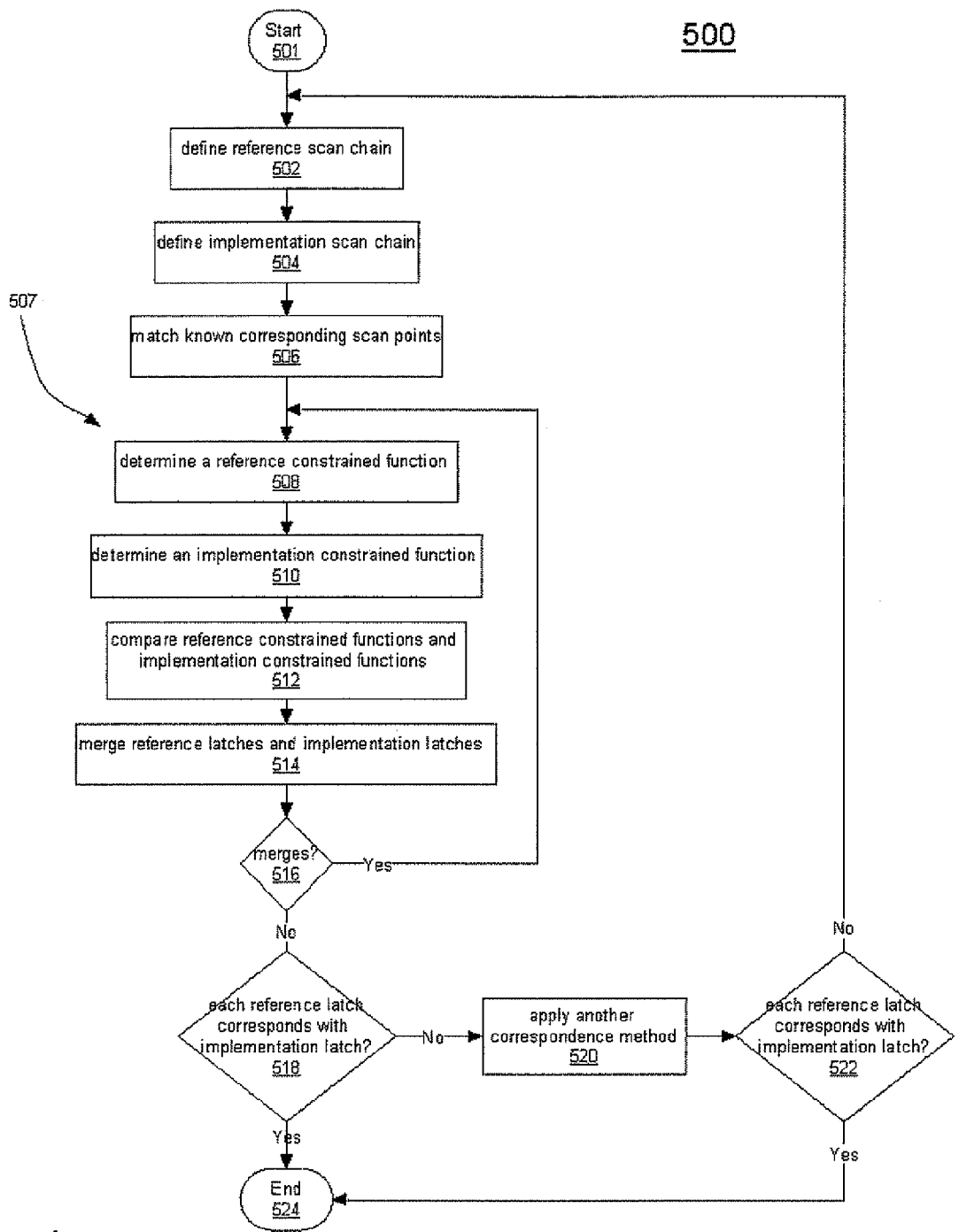
FIG. 4 is a flow chart for a method of determining state point correspondence in accordance with the present invention.

FIG. 4 is a flow chart for a method of determining state point correspondence in accordance with the present invention. The method determines corresponding state points between scan chains of reference and implementation designs to verify equivalence between the reference and implementation designs.

The method 500 includes starting 501, defining a reference scan chain having reference latches and at least one reference constraint for a reference design 502, defining an implementation scan chain having implementation latches and at least one implementation constraint for an implementation design 504, matching known corresponding scan points between the reference scan chain and the implementation scan chain 506, and determining scan chain functional correspondence between the reference latches and the implementation latches 507.

In one embodiment, the determining scan chain functional correspondence between the reference latches and the implementation latches 507 includes determining a reference constrained function 508 for each of the reference latches, determining an implementation constrained function for each of the implementation latches 510, comparing the reference constrained functions and the implementation constrained functions 512, and merging the reference latches and the implementation latches for which the reference constrained functions match the implementation constrained functions 514.

When any of the reference latches and the implementation latches are merged 516, the method can repeat the determining the reference constrained function 508, the determining the implementation constrained function 510, the comparing the reference constrained functions and the implementation constrained functions 512, and the merging the reference latches and the implementation latches 514.

When none of the reference latches and the implementation latches are merged 516, the method can determine whether each of the reference latches corresponds with each of the implementation latches 518. When each of the reference latches corresponds with each of the implementation latches, the method 500 can end 524. When each of the reference latches does not correspond with each of the implementation latches, the method 500 can apply another correspondence method 520. After applying another correspondence method 520, the method 500 can determine whether each of the reference latches corresponds with each of the implementation latches 522. When each of the reference latches corresponds with each of the implementation latches, the method 500 can end 524. When each of the reference latches does not correspond with each of the implementation latches, the method 500 can continue by repeating the scan chain correspondence method starting at 502.

The defining a reference scan chain 502 having a number of reference latches and at least one reference constraint is performed for a reference design. The reference scan chain has reference latches and at least one reference constraint. Each of the reference latches has a reference latch logic cone. The reference constraint has a reference constraint logic cone and is associated with at least one of the reference latches. For the reference design, all clocks are off and the non-scan related data inputs to the reference latches are fixed at one value to limit the reference scan chain to scan logic.

The defining an implementation scan chain having a number of implementation latches and at least one implementation constraint 504 is performed for an implementation design. The implementation scan chain has implementation latches and at least one implementation constraint. Each of the implementation latches has an implementation latch logic cone. The implementation constraint has an implementation constraint logic cone and is associated with at least one of the implementation latches. For the implementation design, all functional clocks are off and the non-scan related data inputs to the implementation latches are fixed at one value to limit the implementation scan chain to scan logic. Scan clocks may be off or not as desired for a particular design.

Some reference and implementation designs are only equivalent when reference and implementation constraints are imposed to force assumptions that are not otherwise readily available or known to be true. Examples of reference and implementation constraints include imposing that two clocks are never on simultaneously or imposing that only one select signal to a multiplexer is on.

The matching known corresponding scan points between the reference scan chain and the implementation scan chain 506 includes matching known corresponding scan points between the reference scan chain and the implementation scan chain by a procedure such as topologic and/or nomenclature similarity. Examples of scan points include input ports, output ports, latches, and registers. Topologic similarity examines the topology of the reference scan chain and the implementation scan chain, looking for structural similarities without respect to intervening logic, such as similarities in "come-from" and "go-to" lists. Nomenclature similarity looks for similarity in the names between the reference scan chain and the implementation scan chain. For example, scan_in can be used as the name of an input port in both the reference scan and implementation scan chain. Similarly, scan_out can be used as the name of an output port in both the reference scan and implementation scan chain. The determination of scan chain functional correspondence 507 can begin at the front of the scan chains, such as at the input port, or at one or multiple intermediate known corresponding scan points matched in the middle of the scan chain, such as ports and/or latch points.

The determining scan chain functional correspondence between the reference latches and the implementation latches 507 includes determining the scan chain functional correspondence from the reference latch logic cones with any associated reference constraint logic cone and the implementation latch logic cones with any associated implementation constraint logic cone. Scan chain functional correspondence as used herein is correspondence between all of the latches and scan points between the reference scan chain and the implementation scan chain. Determining scan chain functional correspondence allows a full equivalence check on the entire design.

The determining a reference constrained function 508 for each of the reference latches includes determining a reference constrained function for each of the reference latches from the reference latch logic cone for the reference latch and any reference constraint logic cone for the reference constraint associated with the reference latch. The reference latch is always associated with a reference latch logic cone, but is not always associated with a reference constraint. When the reference latch is associated with a reference constraint, the reference constrained function is determined from the reference latch logic cone and the reference constraint logic cone. When the reference latch is not associated with a reference constraint, the reference constrained function is determined from the reference latch logic cone.

In one embodiment, the determining a reference constrained function for each of the reference latches 508 can be performed as discussed for FIG. 5 below. The reference constraint can be one of a number of reference constraints with each of the reference constraints having a reference constraint logic cone with at least one reference constraint logic cone input. Each of the reference latch logic cones has at least one reference latch logic cone input.

Referring to FIG. 4, the determining an implementation constrained function for each of the implementation latches 510 includes determining an implementation constrained function for each of the implementation latches from the implementation latch logic cone for the implementation latch and any implementation constraint logic cone for the implementation constraint associated with the implementation latch. The implementation latch is always associated with an implementation latch logic cone, but is not always associated with an implementation constraint. When the implementation latch is associated with an implementation constraint, the implementation constrained function is determined from the implementation latch logic cone and the implementation constraint logic cone. When the implementation latch is not associated with an implementation constraint, the implementation constrained function is determined from the implementation latch logic cone.

In one embodiment, the determining an implementation constrained function for each of the implementation latches 510 can be performed as discussed for FIG. 5 below. The implementation constraint can be one of a number of implementation constraints with each of the implementation constraints having an implementation constraint logic cone with at least one implementation constraint logic cone input. Each of the implementation latch logic cones has at least one implementation latch logic cone input.

Referring to FIG. 4, the comparing the reference constrained functions and the implementation constrained functions 512 can include comparing the canonical signatures for the reference constrained functions and the implementation constrained functions. In this embodiment, each of the reference constrained functions and each of the implementation constrained functions has a canonical signature. The canonical signature is inherent to the constrained function. The canonical signature can be determined when the latch logic cones are extracted from the scan path for a latch.

The merging the reference latches and the implementation latches for which the reference constrained functions match the implementation constrained functions 514 is a part of a round of correspondence. Usually, only one correspondence can be found per round, but operations on the reference scan chain and the implementation scan chain can be performed in parallel to speed up the processing. In addition, when multiple points in a chain are already corresponded by other methods, the chain can be corresponded from each of those points in each round.

In one example of merging, the reference constrained function for a reference latch is f(a,b,c), where f is the reference constrained function and a, b, and c are reference logic cone inputs for the reference latch. The implementation constrained function for a implementation latch is g(a,b,d), where g is the implementation constrained function and a, b, and d are implementation logic cone inputs for the implementation latch. In this example, c and d are latches that drive the reference constrained function f and the implementation constrained function g, respectively. When c and d are found to correspond, c and d can be merged into a single logic cone input e and the reference constrained function becomes f(a,b,e) and the implementation constrained function becomes g(a,b,e). Because f(a,b,e) and g(a,b,e) have the same logic cone inputs, they may be found to be the same function, such as indicated by having the same canonical signature. When f(a,b,e) and g(a,b,e) are the same function, they can be merged. This may reveal additional correspondences between the reference scan chain and the implementation scan chain and facilitate additional merges.

When any of the reference latches and the implementation latches are merged 516, the method can repeat the determining the reference constrained function 508, the determining the implementation constrained function 510, the comparing the reference constrained functions and the implementation constrained functions 512, and the merging the reference latches and the implementation latches 514. After all the merges in a round of correspondence and before the next round, the constrained functions for some latches may need to be redetermined, because the merging can affect which constraints are significant. When a constraint has a constraint logic cone input that is merged, which occurs infrequently, all of the constrained functions are redetermined. When a latch has a latch logic cone input that is merged, which occurs often, the constrained function for the particular latch is redetermined. The number of rounds of correspondence that take place before no more merges are performed depends on the number of latches in the scan chain.

The applying another scan correspondence method when each of the reference latches does not correspond with each of the implementation latches 520 includes applying any other scan correspondence method suitable for the implementation and reference scan chains, such as topologic similarity, nomenclature similarity, or the like. The other scan correspondence methods include function-based and non-function-based methods. The operator can take advantage of the matching of known corresponding scan points and merges already performed to decide what other scan correspondence method is suitable for application to identify additional correspondences.

The method can end 524 when each of the reference latches corresponds with each of the implementation latches, either when determined after the scan chain correspondence method at 518 or determined after applying another correspondence method at 522.

Figure 5:
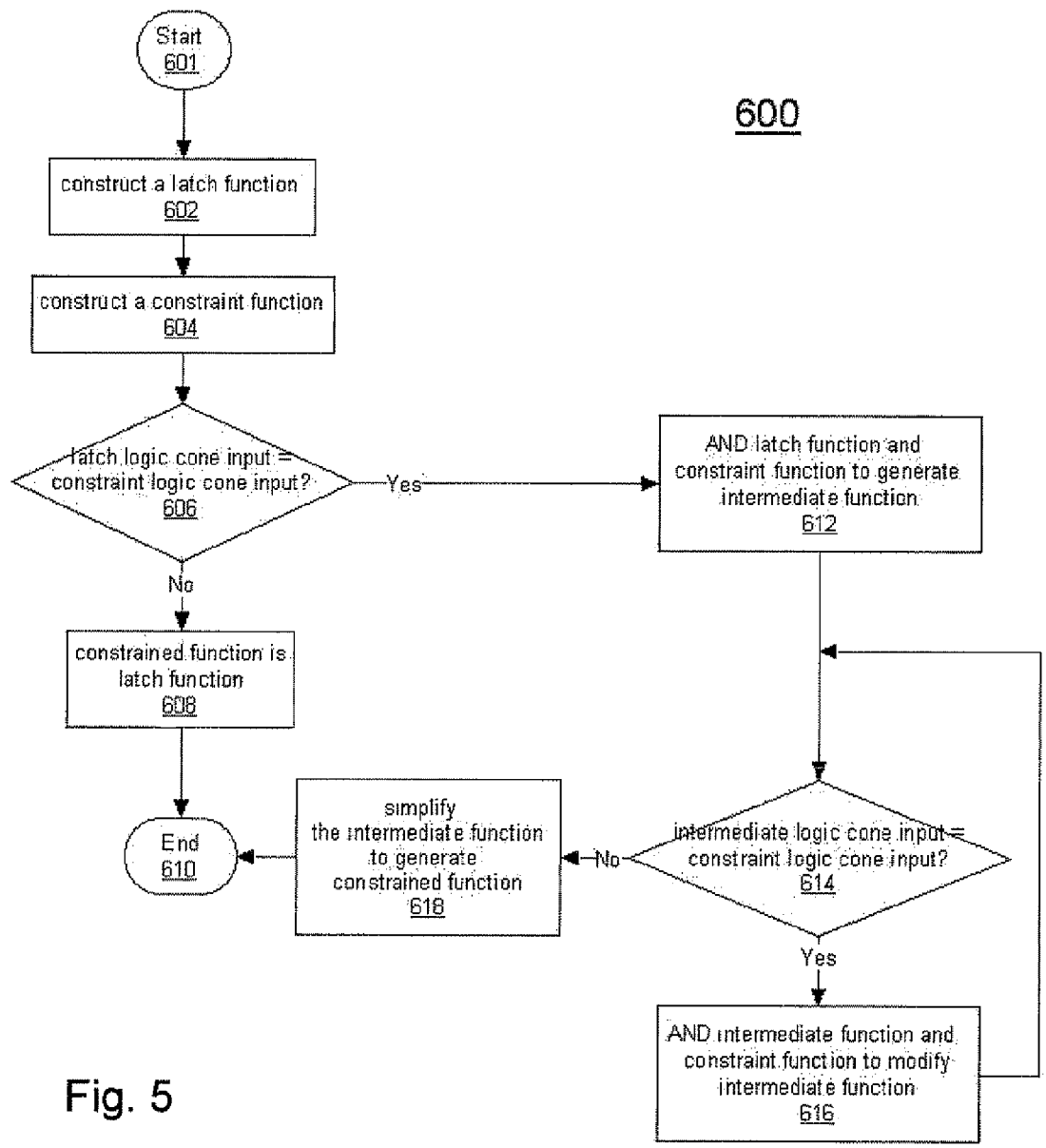
FIG. 5 is a flow chart for a method of generating a constrained function for determining state point correspondence in accordance with the present invention.

FIG. 5 is a flow chart for a method of generating a constrained function for determining state point correspondence in accordance with the present invention. The method 600 can be used for a scan chain having latches and constraints for a design, such as a reference or an implementation design. Each of the latches have a latch logic cone, and each of the constraints have a constraint logic cone and are associated with at least one of the latches. All clocks are off and the non-scan related data inputs to the latches are fixed at one value to limit the scan chain to scan logic.

The method 600 includes starting 601, constructing a latch function for each of the latches from the latch logic cone for the latch 602, constructing a constraint function for each of the constraints from the constraint logic cone for the constraint 604, and determining for each of the latches whether at least one of the latch logic cone inputs for the latch is the same as at least one of the constraint logic cone inputs 606. When at least one of the latch logic cone inputs for the latch is not the same as at least one of the constraint logic cone inputs, the latch function is defined as the constrained function 608.

When at least one of the latch logic cone inputs for the latch is the same as at least one of the constraint logic cone inputs, the latch function and the constraint function are ANDed to generate an intermediate function having an intermediate logic cone with intermediate logic cone inputs for each of the latches 612. It is then determined for each of the latches having an intermediate function whether at least one of the intermediate logic cone inputs for the latch is the same as at least one of the constraint logic cone inputs 614. When at least one of the intermediate logic cone inputs for the latch is the same as at least one of the constraint logic cone inputs, the intermediate function and the constraint function are ANDed to modify the intermediate function for each of the latches having an intermediate function 616. The determining for each of the latches having an intermediate function whether at least one of the intermediate logic cone inputs for the latch is the same as at least one of the constraint logic cone inputs 614 and the ANDing the intermediate function and the constraint function to modify the intermediate function 616 are repeated until no additional intermediate logic cone inputs for the latch are the same as the constraint logic cone inputs.

The intermediate function is then simplified to generate the constrained function 618. The simplification removes superfluous logic cone inputs from the intermediate function. In one embodiment, the intermediate function is simplified to generate the constrained function 618 using existential quantification. The constraint logic cone inputs of the constraint function are extracted as a constraint function support cube, i.e., the Boolean product of the constraint logic cone inputs. The latch logic cone inputs of the latch function are extracted as a latch function support cube, i.e., the Boolean product of the latch logic cone inputs. An intermediate function support cube is constructed by existential quantification of the constraint logic cone inputs of the latch function support cube into the constraint function support cube. The intermediate function support cube has intermediate logic cone inputs and is the same as the constraint function support cube, but with all latch logic cone inputs that occur in the latch function support cube removed. The constrained function is constructed by existential quantification of the intermediate logic cone inputs into the latch function. The constrained function does not include constraint logic cone inputs that were introduced solely by the constraint function and which do not otherwise affect the latch function.

In one embodiment, the latch function and the constraint function are four-valued functional representations of the latch or constraint, respectively. The four-valued functional representations can have a canonical signature inherent to the function. The canonical signature can be determined when the logic cones are extracted from the scan path for a latch or constraint.

FIGS. 6A-6D, in which like elements share like reference numbers, are schematic diagrams of determining state point correspondence for scan chains in accordance with the present invention. The reference and implementation scan chains are compared and like reference and implementation latches are merged.

Figure 6A:
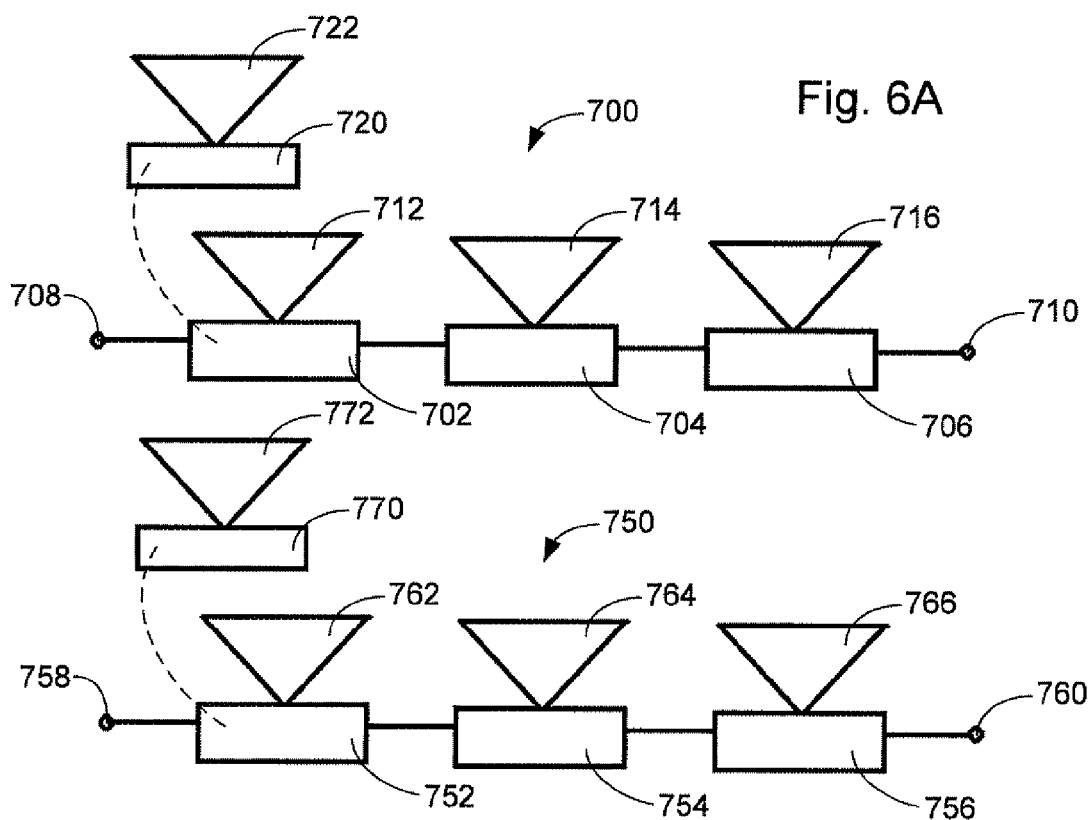
FIGS. 6A-6D are schematic diagrams of determining state point correspondence for scan chains in accordance with the present invention.

Referring to FIG. 6A, the reference scan chain 700 for a reference design includes reference latches 702, 704, and 706 operably connected between reference scan-in 708 and reference scan-out 710. Each of the reference latches 702, 704, and 706 has a reference latch logic cone 712, 714, and 716, respectively. In this example, reference constraint 720, which has reference constraint logic cone 722, is associated with the reference latch 702 as shown by the dashed line.

The implementation scan chain 750 for an implementation design includes implementation latches 752, 754, and 756 operably connected between implementation scan-in 758 and implementation scan-out 760. Each of the implementation latches 752, 754, and 756 has an implementation latch logic cone 762, 764, and 766, respectively. In this example, implementation constraint 770, which has implementation constraint logic cone 772, is associated with the implementation latch 752 as shown by the dashed line.

Figure 6B:
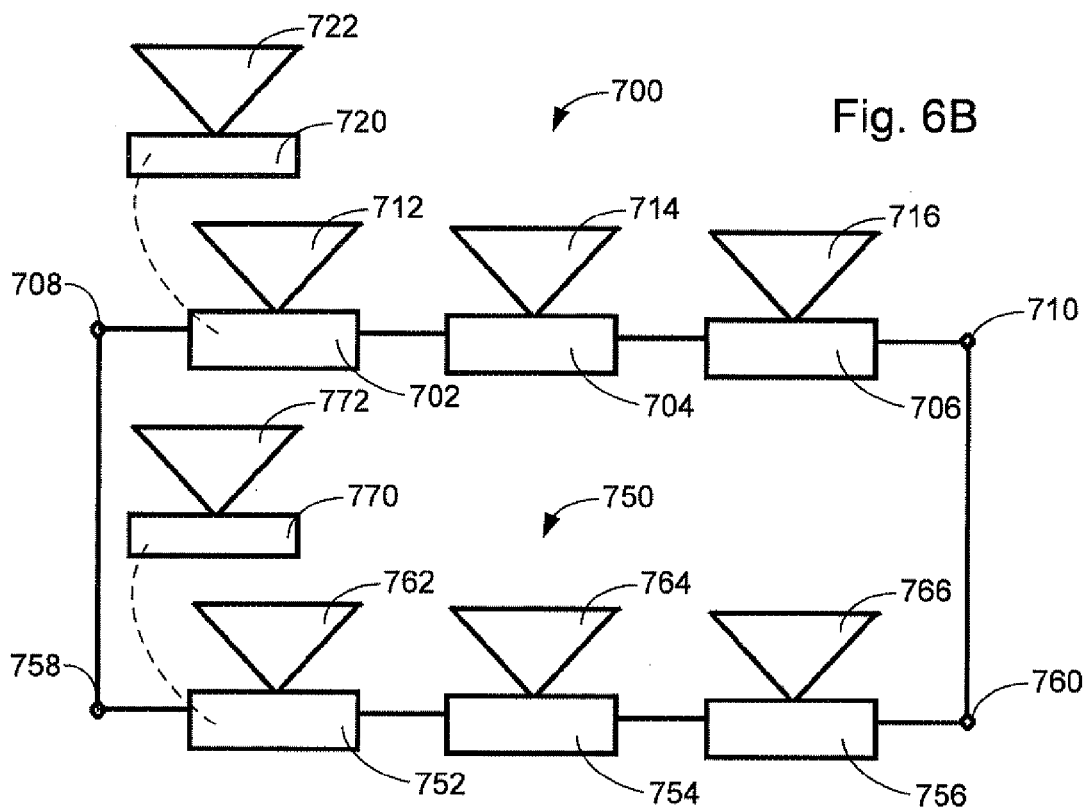

Referring to FIG. 6B, the known corresponding scan points are matched. In this example, the known corresponding scan points are reference scan-in 708 corresponding to implementation scan-in 758 and reference scan-out 710 corresponding to implementation scan-out 760. The known corresponding scan points for matching can be identified by a procedure such as topologic similarity, e.g., input ports, output ports, such as nomenclature similarity, e.g., scan point names, or the like.

Figure 6C:
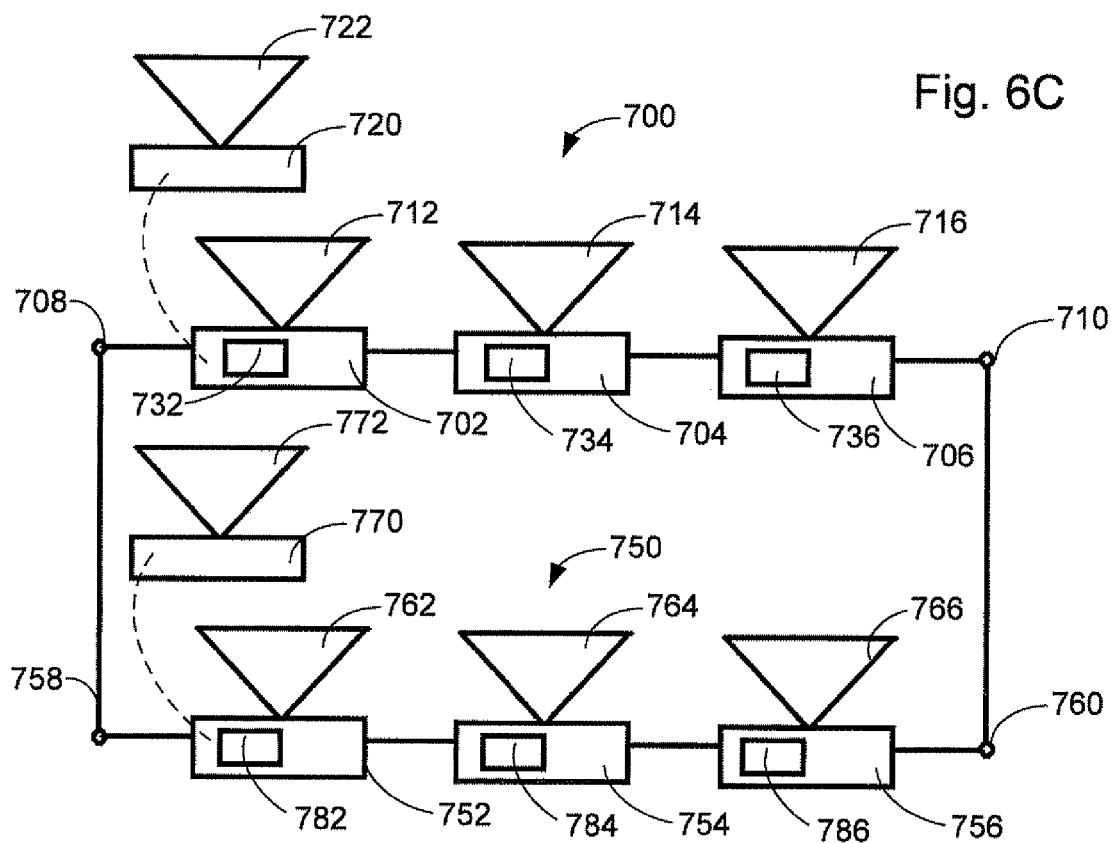

Referring to FIG. 6C, a constrained function is determined for each of the latches. The reference constrained function 732 for the reference latch 702 is determined from the reference latch logic cone 712 and reference constraint logic cone 722 for the reference constraint 720 associated with the reference latch 702. The implementation constrained function 782 for the implementation latch 752 is determined from the implementation latch logic cone 762 and implementation constraint logic cone 772 for the implementation constraint 770 associated with the implementation latch 752. The other latches are not associated with a constraint, so the reference constrained functions 734 and 736 are determined from the reference latch logic cones 714 and 716, respectively, and the implementation constrained functions 784 and 786 are determined from the implementation latch logic cones 764 and 766, respectively.

Figure 6D:
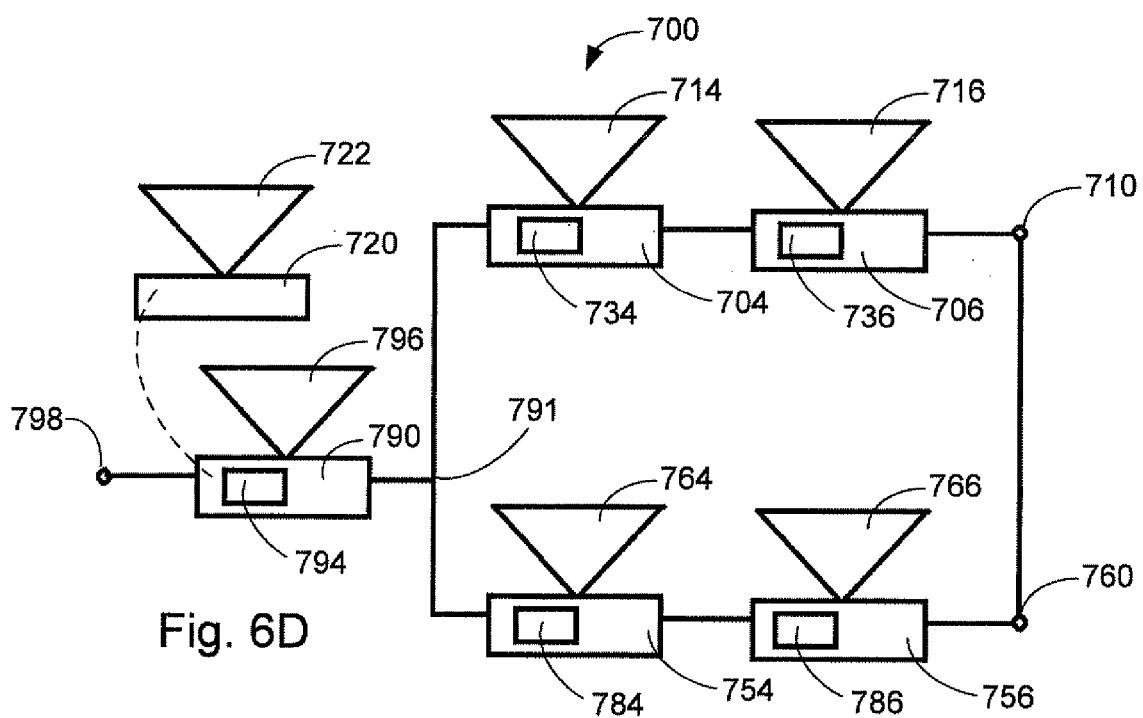

Referring to FIG. 6D, the reference constrained functions and the implementation constrained functions have been compared and the reference and implementation latches with matching constrained functions are merged. In this example, the reference constrained function 732 and the implementation constrained function 782 were compared and found to match, so the reference latch 702 and the implementation latch 752 can be merged into merged latch 790 having merged constrained function 794 and merged logic cone 796. The merged constrained function 794 is the same as the reference constrained function 732 and the implementation constrained function 782. The merged latch 790 is associated with merged constraint 796 which has merged constraint logic cone 798. With the merger of the reference latch 702 and the implementation latch 752 into the merged latch 790, the output 791 of the merged latch 790 is operably connected to the inputs of both reference latch 704 and the implementation latch 754. Similarly, the known corresponding scan points reference scan-in 708 and implementation scan-in 758 are merged as scan chain scan-in 798. This information gained from the merges can be used to find additional latches and scan points for merger.

FIGS. 7A-7D, in which like elements share like reference numbers, are schematic diagrams of generating a constrained function for determining state point correspondence in accordance with the present invention. Latch functions and constraint functions are combined to generate the constrained function.

Figure 7A:
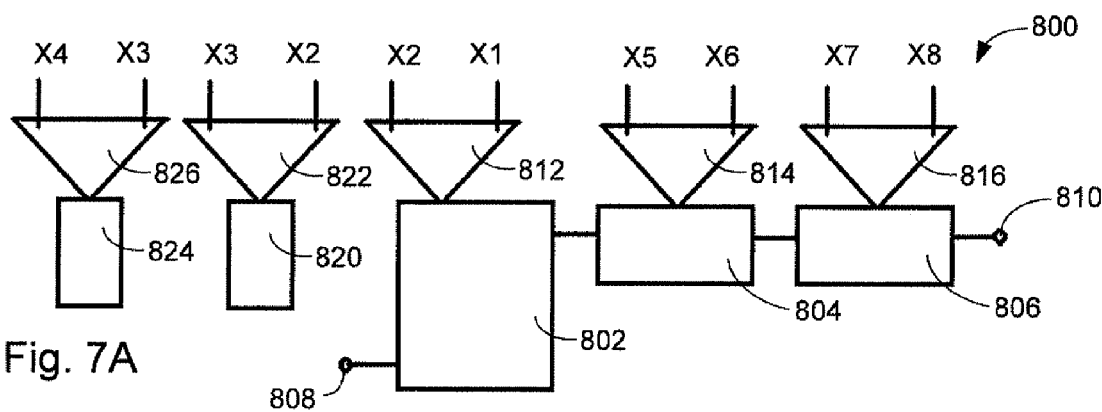
FIGS. 7A-7E are schematic diagrams of generating a constrained function for determining state point correspondence in accordance with the present invention.

Referring to FIG. 7A, the scan chain 800 for a design, such as a reference design or an implementation design, includes latches 802, 804, and 806 operably connected between scan-in 808 and scan-out 810. Each of the latches 802, 804, and 806 has a latch logic cone 812, 814, and 816, respectively. The design also includes constraint 820 having constraint logic cone 822 and constraint 824 having constraint logic cone 826. In this example, the latch logic cones 812, 814, and 816 have inputs X1 and X2, X5 and X6, X7 and X8, respectively, while the constraint logic cone 822 has inputs X2 and X3, and the constraint logic cone 826 has inputs X3 and X4. The scan chain 800 can be a reference scan chain, an implementation scan chain, or any other scan chain for which it is desired to generate a constrained function.

Figure 7B:
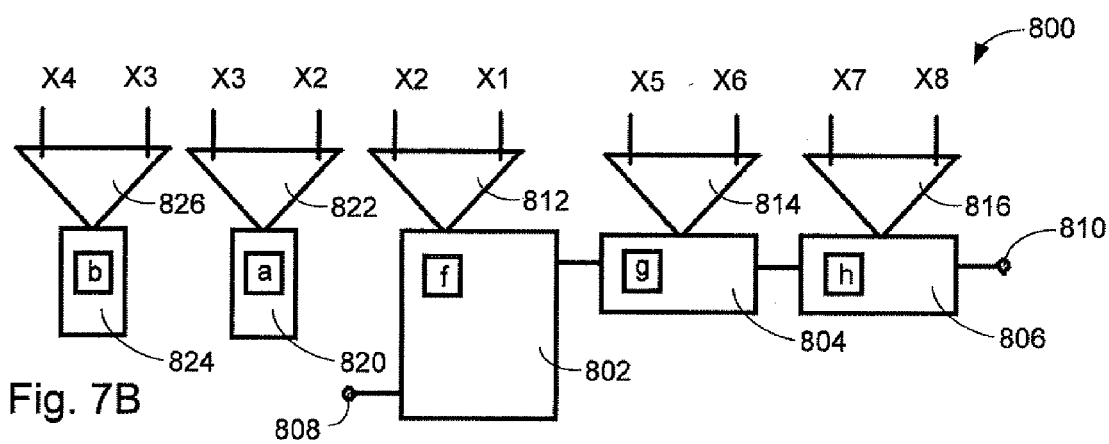

Referring to FIG. 7B, latch functions for each of the latches are constructed from the latch logic cone for the latch and constraint functions are constructed for each of the constraints from the constraint logic cone for the reference constraint. The latch functions f(X1, X2), g(X5, X6), and h(X7, X8) are constructed for latches 802, 804, and 806, respectively. The constraint functions a(X2, X3) and b(X3, X4) are constructed for constraints 820 and 824, respectively. In one embodiment, the latch functions and the constraint functions are four-valued functional representations.

Figure 7C:
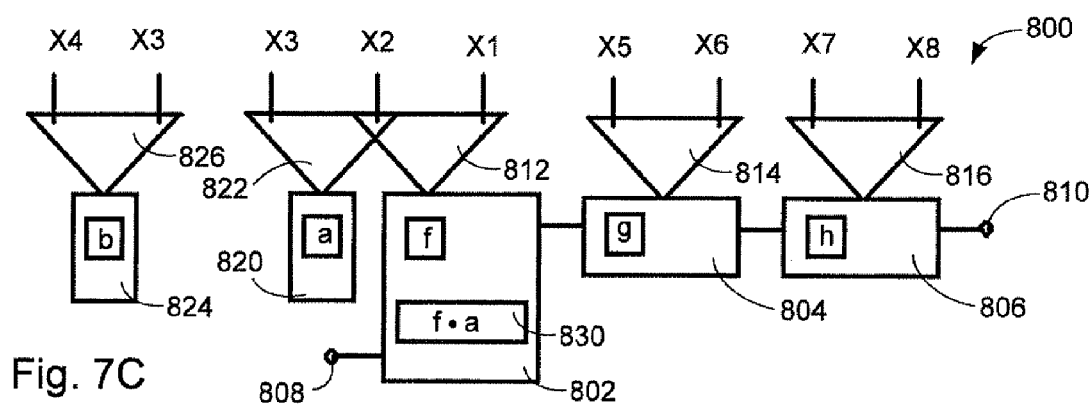

Referring to FIG. 7C, an intermediate function is generated by ANDing latch and constraint functions, when a constraint is associated with the latch. A constraint is associated with a latch when the logic cone for each has at least one common logic cone input. In this example, the latch logic cone 812 has logic cone input X2 in common with the constraint logic cone 822, so the latch 802 is associated with the constraint 820. Intermediate function 830 for the latch 802 is generated by ANDing the latch function f(X1, X2) for the latch 802 with the constraint function a(X2, X3) for the constraint 820 to obtain f(X1, X2)·a(X2, X3). When no constraint function is associated with the latch, the intermediate function is the latch function.

Figure 7D:
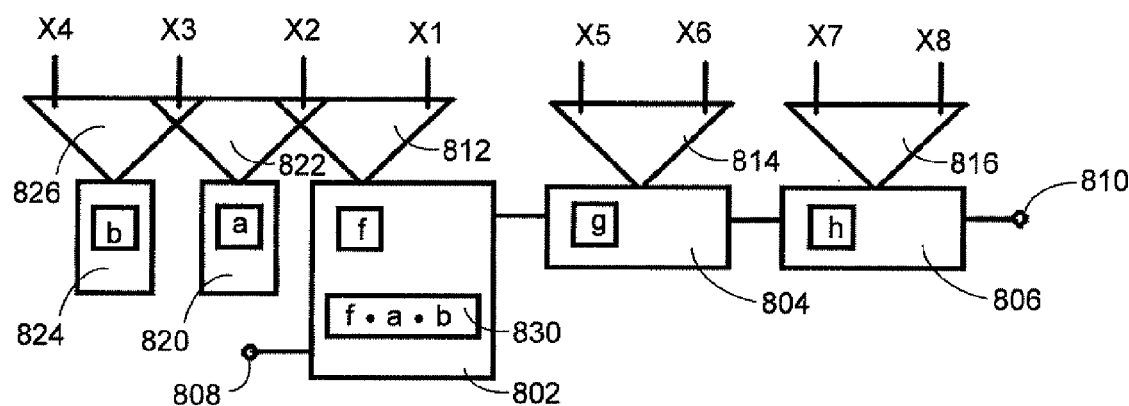

Referring to FIG. 7D, the intermediate function is modified by ANDing the intermediate and constraint functions, when another constraint is associated with the latch. Another constraint is associated with a latch having an intermediate function when the logic cone for each has at least one common logic cone input. In this example, the latch logic cones 812 and 822 for the latch 812 having the intermediate function 830 have logic cone input X3 in common with the constraint logic cone 824, so the latch 802 is associated with the constraint 824. Intermediate function 830 for the latch 802 is modified by ANDing the intermediate function 830 [f(X1, X2)·a(X2, X3)] for the latch 802 with the constraint function b(X3, X4) for the constraint 824 to obtain the intermediate function 830 [f(X1, X2)·a(X2, X3)·b(X3, X4)].

Figure 7E:
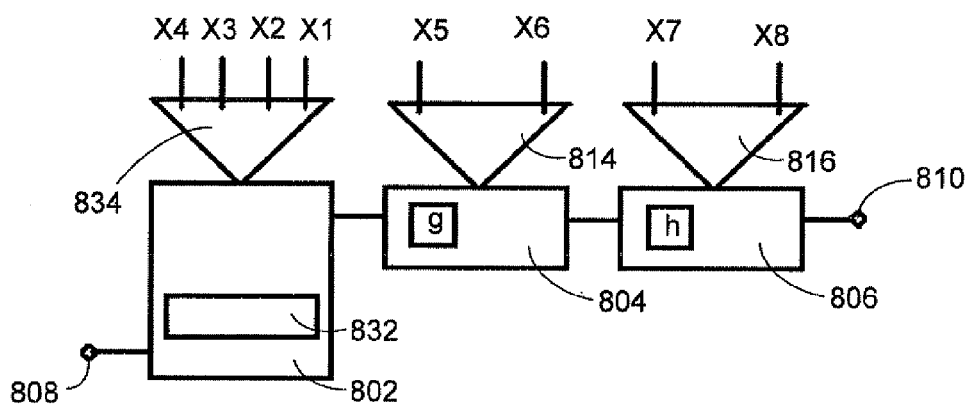

Referring to FIG. 7E, the intermediate function is existentially quantified to generate the reference constrained function. In this example, the latch 802 has a constrained function 832 generated from the intermediate function 830 [f(X1, X2)·a(X2, X3)·b(X3, X4)]. The latch 802 has logic cone 834 with logic cone inputs X1, X2, X3, and X4, which are the original logic cone inputs to the latch 802, constraint 820, and constraint 824.

Figure 8:
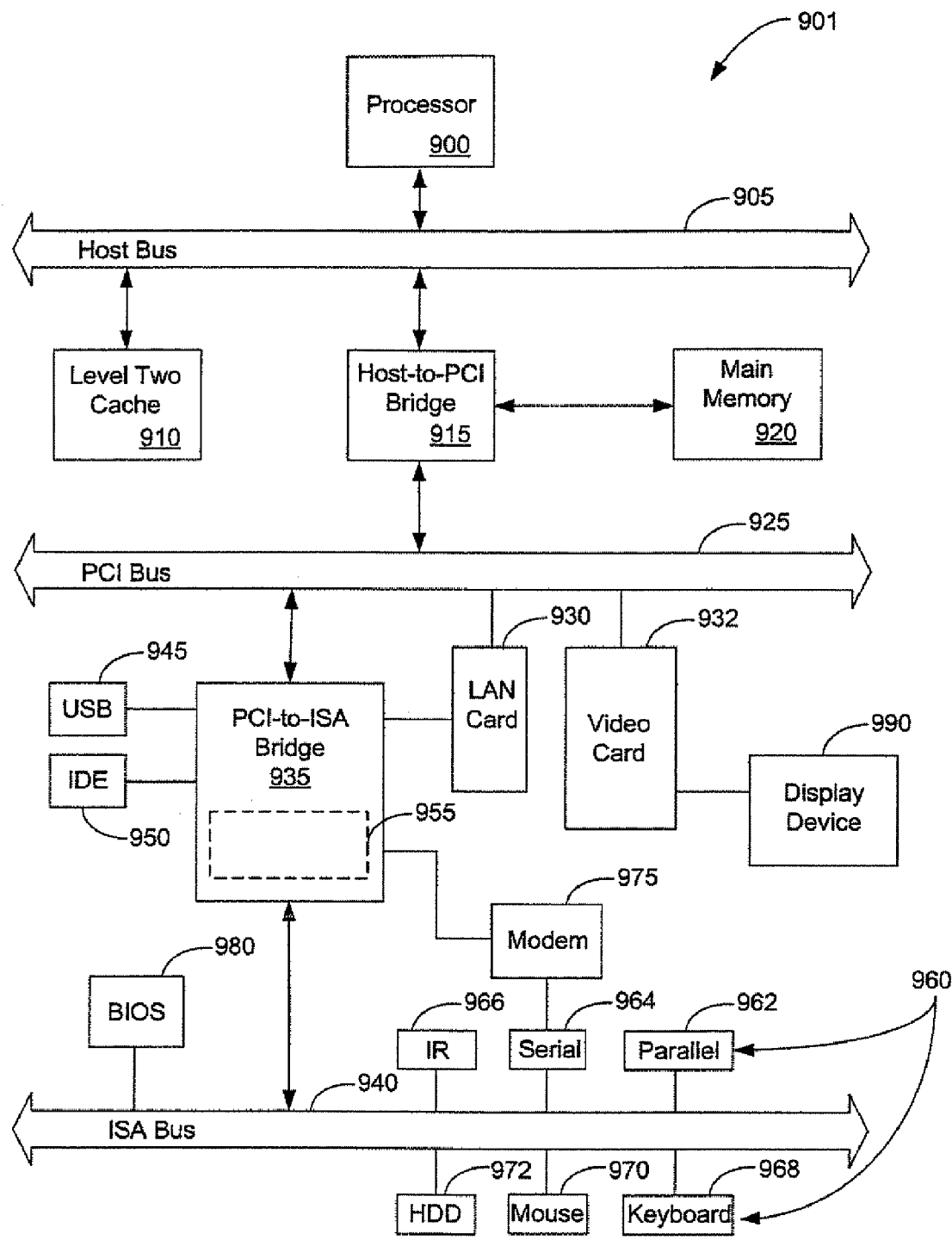
FIG. 8 is a block diagram of an information handling system for implementing state point correspondence determination in accordance with the present invention.

FIG. 8 is a block diagram of an information handling system for implementing state point correspondence determination in accordance with the present invention. The information handling system 901 is a simplified example of a computer system capable of performing the operations described herein. The information handling system 901 includes processor 900 which is coupled to host bus 905. A level two (L2) cache memory 910 is also coupled to the host bus 905. Host-to-PCI bridge 915 is coupled to main memory 920, includes cache memory and main memory control functions, and provides bus control to handle transfers among PCI bus 925, processor 900, L2 cache 910, main memory 920, and host bus 905. The PCI bus 925 provides an interface for a variety of devices including, for example, LAN card 930 and/or video card 932. The video card 932 is operably connected to a display device 990, such as a liquid crystal display (LCD), a cathode ray tube (CRT) display, a projection display, or the like. The display device 990 can be used for spatial/tabular data presentation in accordance with the present invention. Those skilled in the art will appreciate that the video card 932 can be attached to other types of busses, such as an AGP or a PCI Express bus, as desired for a particular application.

PCI-to-ISA bridge 935 provides bus control to handle transfers between the PCI bus 925 and ISA bus 940, universal serial bus (USB) functionality 945, IDE device functionality 950, power management functionality 955, and can include other functional elements not shown, such as a real-time clock (RTC), DMA control, interrupt support, and system management bus support. Peripheral devices and input/output (I/O) devices can be attached to various interfaces 960 (e.g., parallel interface 962, serial interface 964, infrared (IR) interface 966, keyboard interface 968, mouse interface 970, and fixed disk (HDD) 972) coupled to ISA bus 940. Alternatively, a super I/O controller (not shown) can be attached to the ISA bus 940 to accommodate many I/O devices.

BIOS 980 is coupled to ISA bus 940, and incorporates the necessary processor executable code for a variety of low-level system functions and system boot functions. The BIOS 980 can be stored in any computer readable medium, including magnetic storage media, optical storage media, flash memory, random access memory, read only memory, and communications media conveying signals encoding the instructions (e.g., signals from a network). In order to attach information handling system 901 to another computer system to copy files over a network, LAN card 930 is coupled to PCI bus 925 and to PCI-to-ISA bridge 935. Similarly, to connect computer system 901 to an ISP to connect to the Internet using a telephone line connection, modem 975 is connected to serial port 964 and PCI-to-ISA Bridge 935.

While the computer system described in FIG. 8 is capable of executing the invention described herein, this computer system is simply one example of a computer system. Those skilled in the art will appreciate that many other computer system designs are capable of performing the invention described herein.

One of the preferred implementations of the invention is an application, namely, a set of instructions (program code) in a code module which may, for example, be resident in the random access memory of the computer. Until required by the computer, the set of instructions may be stored in another computer memory, for example, on a hard disk drive, or in removable storage such as an optical disk (for eventual use in a CD ROM) or floppy disk (for eventual use in a floppy disk drive), or downloaded via the Internet or other computer network. Thus, the present invention may be implemented as a computer program stored on a computer readable medium and executable by a digital processing apparatus to perform operations to determine scan chain correspondence. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

It is important to note that the figures and description illustrate specific applications and embodiments of the present invention, and is not intended to limit the scope of the present disclosure or claims to that which is presented therein. Those skilled in the art will appreciate that the present invention is not limited to use with scan chain logic. The present invention can also be used for more complex designs where the functional logic is not too complex. In one example, the present invention can be used for latch correspondence which does not focus upon the scan chain logic. In another example, the present invention can be used for correspondencing "black boxes," i.e., boxes in a design where only the boundary Input/Output is examined. The black boxes can be corresponded by producing signatures for each input pin. Upon reading the specification and reviewing the drawings hereof, it will become immediately obvious to those skilled in the art that myriad other embodiments of the present invention are possible, and that such embodiments are contemplated and fall within the scope of the presently claimed invention.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

What is claimed is:

1. A method for determining scan chain correspondence between a reference design level and an implementation design level of an integrated circuit, comprising:

defining a reference scan chain at the reference design level having reference latches and reference constraints, each of the reference latches having a reference latch logic cone, each of the reference constraints having a reference constraint logic cone with at least one reference constraint logic cone input and being associated with at least one of the reference latches wherein each of the reference latch logic cones has at least one reference latch logic cone input;

defining an implementation scan chain at the implementation design level having implementation latches and at least one implementation constraint, each of the implementation latches having an implementation latch logic cone, the implementation constraint having an implementation constraint logic cone and being associated with at least one of the implementation latches;

matching known corresponding scan points between the reference scan chain and the implementation scan chain; and determining scan chain functional correspondence between the reference latches and the implementation latches from the reference latch logic cones with any associated reference constraint logic cone and the implementation latch logic cones with any associated implementation constraint logic cone, wherein the determining includes determining a reference constrained function for each of the reference latches from the reference latch logic cone for the reference latch and any reference constraint logic cone for the reference constraint associated with the reference latch by constructing a reference latch function for each of the reference latches from the reference latch logic cone for the reference latch, constructing a reference constraint function for each of the reference constraints from the reference constraint logic cone for the reference constraint, determining for each of the reference latches whether at least one of the reference latch logic cone inputs for the reference latch is the same as at least one of the reference constraint logic cone inputs, defining the reference latch function as the reference constrained function when at least one of the reference latch logic cone inputs for the reference latch is not the same as at least one of the reference constraint logic cone inputs, ANDing the reference latch function and the reference constraint function to generate an intermediate reference function having an intermediate reference logic cone with intermediate reference logic cone inputs for each of the reference latches when at least one of the reference latch logic cone inputs for the reference latch is the same as at least one of the reference constraint logic cone inputs, determining for each of the reference latches having an intermediate reference function whether at least one of the intermediate reference logic cone inputs for the reference latch is the same as at least one of the reference constraint logic cone inputs, ANDing the intermediate reference function and the reference constraint function to modify the intermediate reference function for each of the reference latches having an intermediate reference function when at least one of the intermediate reference logic cone inputs for the reference latch is the same as at least one of the reference constraint logic cone inputs, repeating the determining for each of the reference latches having an intermediate reference function whether at least one of the intermediate reference logic cone inputs for the reference latch is the same as at least one of the reference constraint logic cone inputs and the ANDing the intermediate reference function and the reference constraint function to modify the intermediate reference function until no additional intermediate reference logic cone inputs for the reference latch are the same as the reference constraint logic cone inputs, and simplifying the intermediate reference function to generate the reference constrained function;

determining an implementation constrained function for each of the implementation latches from the implementation latch logic cone for the implementation latch and any implementation constraint logic cone for the implementation constraint associated with the implementation latch;

comparing the reference constrained functions and the implementation constrained functions; and merging the reference latches and the implementation latches for which the reference constrained functions match the implementation constrained functions.

2. The method of claim 1 further comprising:

determining whether any of the reference latches and the implementation latches were merged; and when any of the reference latches and the implementation latches were merged, repeating the determining the reference constrained function, the determining the implementation constrained function, the comparing, and the merging.

3. The method of claim 2 further comprising:

determining whether each of the reference latches corresponds with each of the implementation latches when none of the reference latches and the implementation latches were merged; and applying another scan correspondence method when each of the reference latches does not correspond with each of the implementation latches.

4. A method for determining scan chain correspondence comprising:

defining a reference scan chain having reference latches and at least one reference constraint, each of the reference latches having a reference latch logic cone, the reference constraint having a reference constraint logic cone and being associated with at least one of the reference latches;

defining an implementation scan chain having implementation latches and implementation constraints, each of the implementation latches having an implementation latch logic cone, each of the implementation constraints having an implementation constraint logic cone with at least one implementation constraint logic cone input and being associated with at least one of the implementation latches wherein each of the implementation latch logic cones has at least one implementation latch logic cone input;

matching known corresponding scan points between the reference scan chain and the implementation scan chain; and determining scan chain functional correspondence between the reference latches and the implementation latches from the reference latch logic cones with any associated reference constraint logic cone and the implementation latch logic cones with any associated implementation constraint logic cone, wherein the determining includes determining a reference constrained function for each of the reference latches from the reference latch logic cone for the reference latch and any reference constraint logic cone for the reference constraint associated with the reference latch;

determining an implementation constrained function for each of the implementation latches from the implementation latch logic cone for the implementation latch and any implementation constraint logic cone for the implementation constraint associated with the implementation latch by constructing a implementation latch function for each of the implementation latches from the implementation latch logic cone for the implementation latch, constructing a implementation constraint function for each of the implementation constraints from the implementation constraint logic cone for the implementation constraint, determining for each of the implementation latches whether at least one of the implementation latch logic cone inputs for the implementation latch is the same as at least one of the implementation constraint logic cone inputs, defining the implementation latch function as the implementation constrained function when at least one of the implementation latch logic cone inputs for the implementation latch is not the same as at least one of the implementation constraint logic cone inputs, ANDing the implementation latch function and the implementation constraint function to generate an intermediate implementation function having an intermediate implementation logic cone with intermediate implementation logic cone inputs for each of the implementation latches when at least one of the implementation latch logic cone inputs for the implementation latch is the same as at least one of the implementation constraint logic cone inputs, determining for each of the implementation latches having an intermediate implementation function whether at least one of the intermediate implementation logic cone inputs for the implementation latch is the same as at least one of the implementation constraint logic cone inputsm, ANDing the intermediate implementation function and the implementation constraint function to modify the intermediate implementation function for each of the implementation latches having an intermediate implementation function when at least one of the intermediate implementation logic cone inputs for the implementation latch is the same as at least one of the implementation constraint logic cone inputs, repeating the determining for each of the implementation latches having an intermediate implementation function whether at least one of the intermediate implementation logic cone inputs for the implementation latch is the same as at least one of the implementation constraint logic cone inputs and the ANDing the intermediate implementation function and the implementation constraint function to modify the intermediate implementation function until no additional intermediate implementation logic cone inputs for the implementation latch are the same as the implementation constraint logic cone inputs; and simplifying the intermediate implementation function to generate the implementation constrained function;

comparing the reference constrained functions and the implementation constrained functions; and merging the reference latches and the implementation latches for which the reference constrained functions match the implementation constrained functions.

* * * * *